United States Patent [19]

Banks

[11] 4,256,535
[45] Mar. 17, 1981

[54] METHOD OF POLISHING A SEMICONDUCTOR WAFER

[75] Inventor: Edward L. Banks, Willingboro, N.J.

[73] Assignee: Western Electric Company, Inc., New York, N.Y.

[21] Appl. No.: 100,622

[22] Filed: Dec. 5, 1979

[51] Int. Cl.³ .......................................... H01L 21/306
[52] U.S. Cl. .................. 156/645; 51/281 R; 156/662
[58] Field of Search ..................... 156/636, 645, 662; 51/281 R, 281 SF, 316, 317, 327, 283 R, 216 T, 284 R, 131.1

[56] References Cited

U.S. PATENT DOCUMENTS

| | | | |
|---|---|---|---|
| 3,342,652 | 9/1967 | Reisman et al. | 156/636 |
| 3,436,286 | 4/1969 | Lange | 156/636 X |
| 3,860,399 | 1/1975 | Noble et al. | 51/283 |
| 4,165,584 | 8/1979 | Scherrer | 51/131.1 |

OTHER PUBLICATIONS

IBM Technical Disclosure Bulletin, vol. 12, No. 12, May 1970, Positive Drive Polishing Machine by J. N. Gowans et al., pp. 2065–2066.
IBM Technical Disclosure Bulletin, vol. 15, No. 6, Nov. 1972, Planetary "Free" Wafer Polished by F. E. Goetz et al., pp. 1760–1761.

Primary Examiner—William A. Powell
Attorney, Agent, or Firm—D. J. Kirk

[57] ABSTRACT

A semiconductor wafer (31) is placed on a non-porous, flat, substrate (10), with a thin layer of water (21) interposed therebetween. The substrate (10) with the wafer (31) thereon is placed in a polishing machine (40) where a rotating polishing pad (43) polishes the wafer which is permitted to float free and rotate on the thin layer of water (21) during the polishing operation.

6 Claims, 4 Drawing Figures

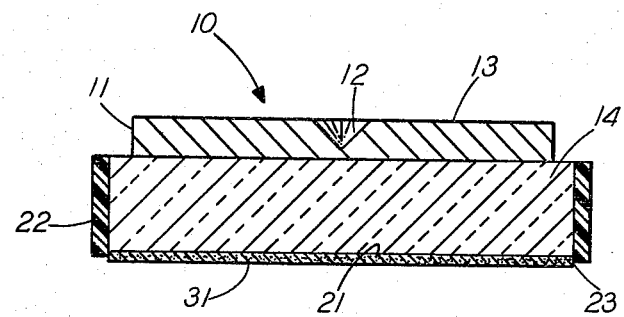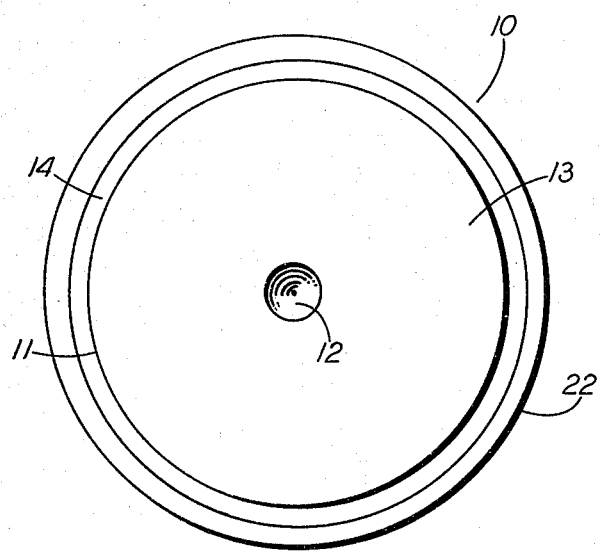
FIG.-2

FIG.-4
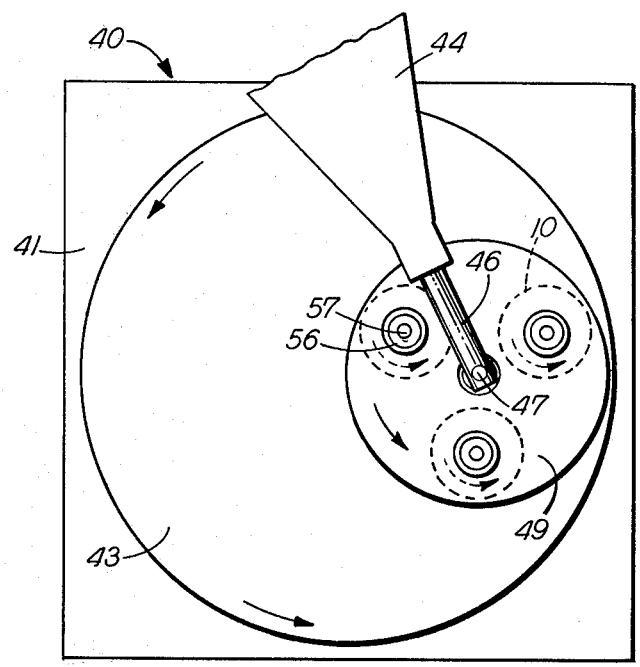
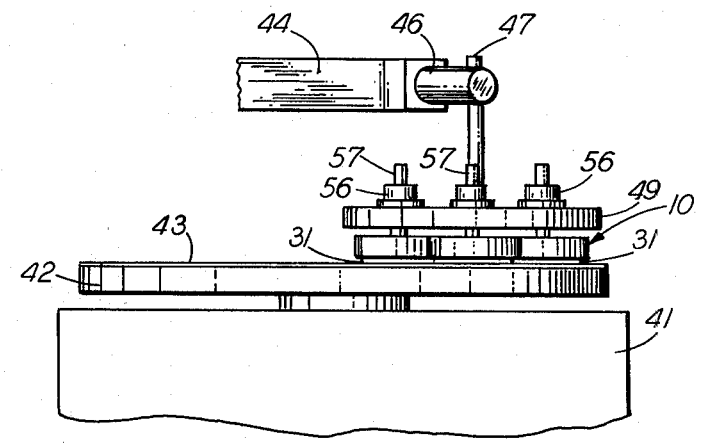
FIG.-3

METHOD OF POLISHING A SEMICONDUCTOR WAFER

TECHNICAL FIELD

The invention is related to semiconductor processing. In particular, the invention is directed to polishing of a semiconductor wafer to a high degree of flatness.

BACKGROUND OF THE INVENTION

In the electronics industry there is a consistent trend to increase the number of devices that can be formed on a semiconductor wafer. This requires that extremely small line widths be photolithographically printed on the wafer. However, most photolithographic techniques are limited by the degree of flatness of the wafer surface for the depth of focus of projection printers cannot be adjusted to compensate for surface variation which restricts the resolution of the fine line patterns.

The last step in most semiconductor fabrication processes, prior to forming devices on a wafer is to polish the wafer to as high a degree of flatness as possible. The present technique is to place the wafer between a stainless steel, polyurethane coated, holder and a polishing pad. The wafer is tightly held by the polyurethane coating while the holder and the pad are rotated in same direction to polish the wafer. This technique results in variations of surface flatness of approximately eight microns. Such variations result in decreased yields of acceptable devices as the number of devices per unit area increases.

Accordingly, there is a need for a semiconductor wafer polishing technique that can substantially decrease the flatness variations of a semiconductor wafer.

SUMMARY OF THE INVENTION

The foregoing problem has been overcome by placing the wafer on a flat, non-porous substrate with a liquid interposed therebetween. The wafer is then polished with a rotating polishing pad while the wafer is permitted free floating, rotative motion during polishing.

Advantageously, the instant technique makes it possible to polish semiconductor wafers to a flatness variation of about one micron.

BRIEF DESCRIPTION OF THE DRAWINGS

FIG. 1 is a cross-sectional view of a semiconductor wafer holder;

FIG. 2 is a plan view of the wafer holder;

FIG. 3 is a side view of a semiconductor wafer polishing apparatus; and

FIG. 4 is a plan view of the wafer polishing apparatus.

DETAILED DESCRIPTION

A wafer holder, used to implement the instant semiconductor wafer polishing technique, is generally indicated by the numeral 10 in FIGS. 1 and 2. The holder 10 is comprised of a metallic disc 11 having a first conically-shaped hole 12 in the central portion of a top surface 13. The disc 11 is bonded to a rigid, non-porous member 14 such as a fused silica optical flat, having a low coefficient of expansion and which has a lower surface 21 having a flatness of $\frac{1}{4}\lambda$. A band 22 made of Teflon material, or the like, is wrapped about the periphery of the member 14 and extends slightly below the lower surface 21 to form a lip 23. In one embodiment the band 22 was $\frac{1}{8}$ inch thick, $\frac{7}{8}$" wide and extended about 0.015 inch below the surface 21.

In operation a substantially circular silicon wafer 31 having a diameter of three inches and a thickness of approximately 0.025 inch is placed in double-sided planetary lapping machine (not shown) and lapped to a rough surface flatness of about one micron using an eleven micron aluminum oxide abrasive. The flatness of the lapped wafer is important for it has been found that the instant polishing technique will yield a smooth surface flatness no better than that of the lapped wafer 31. After the lapping step the wafer 31 is etched to remove approximately two mils of material therefrom (i.e., one mil from each side). In a first embodiment the wafers 31—31 were etched in an acidic etch at 50° C. resulting in wafers emerging from the etchant at about 4 to 7 microns concave. In a second embodiment the wafers 31—31 were etched in a caustic etch at 90° C.; these wafers retained their original flatness of about one micron. In both embodiments the wafers 31—31 were immersed in the etchant for a time sufficient to remove approximately two mils of material from each wafer.

Upon completion of the etching step a drop of water is placed on the surface 21 of the non-porous member 14 and the etched wafer 31 is placed thereon. The water acts as a lubricant between the wafer 31 and the non-porous member 14 while preventing contact therebetween. The wafer 31 should be firmly pressed onto the member 14 until a slight drag is felt between the member and the wafer. If an excess of water is applied to the member 14, or the wafer 31 is not pressed firmly thereon, undesirably the wafer will be polished to about four microns concave.

A plurality of holders 10—10 with the wafer 31 thereon are positioned in a polishing machine generally indicated by the numeral 40 in FIGS. 3 and 4 which are side and top views, respectively, of the machine. The polishing machine 40 is comprised of base 41 and a rotatable polishing plate 42 having a polishing pad 43 thereon. An upper arm 44 has an extension member 46 fixedly attached to a vertical rod 47 having a hemispherical end (not shown) positioned in a second conically-shaped hole 48 located in an upper plate 49. A plurality of bearings 56—56 are positioned in the upper plate 49 with a quill 57 rotatably mounted therein. Each quill 57 has a hemispherical end (not shown) that seats in the conically-shaped hole 12 in the holder 10.

Thus, with the holders 10—10 in place on the apparatus 40, as shown in FIGS. 3 and 4, the polishing plate 42 is rotated in a counterclockwise direction causing the upper plate 49 to also rotate in counterclockwise manner about the rod 47. Each wafer 31 placed in a holder 10 has a diameter that is smaller than that of the non-porous member 14 which allows free floating, rotational movement of the wafer on the water, within the confines of the lip 23 of the band 22. The upper arm 44 is weighted to provide approximately three pounds per square inch on the wafers 31—31, and the polishing plate 42 is rotated at 80 r.p.m., which rotates the upper plate 49 with the holders 10—10, with the wafers therein, very slowly. In the exemplary embodiments the wafers 31—31 were polished in the apparatus 40 for approximately one hour and fifteen minutes to remove one mil of material and resulted in a flatness variation of one micron for the caustic etched wafers and 4 to 7 microns for the acidic etched wafers.

It is to be understood that the embodiment described herein is merely illustrative of the principles of the invention. Various modifications may be made thereto by persons skilled in the art without departing from the spirit and scope of the invention.

What is claimed is:

1. A method of polishing a semiconductor wafer having first and second major surfaces, comprising the steps of:
   (a) placing the first major surface of the wafer on a flat non-porous substrate with a liquid interposed therebetween;
   (b) polishing the second major surface of the wafer with a rotating polishing pad; and
   (c) permitting free floating, rotative motion of the wafer during polishing.

2. The method as set forth in claim 1, characterized by:
   prior to step (a);
   lapping the wafer to a flatness of about one micron; and
   etching the wafer to remove approximately one mil of material from each side of the wafer.

3. The method as set forth in claim 2, wherein:
   the wafer was etched in an acidic etch at 50° C.

4. The method as set forth in claim 2, wherein:
   the wafer was etched in a caustic etch at 90° C.

5. The method as set forth in claim 1, wherein:
   the liquid is water.

6. The method as set forth in claim 1, wherein:
   the wafer is silicon.